United States Patent
Hou et al.

(10) Patent No.: US 10,448,540 B2
(45) Date of Patent: Oct. 15, 2019

(54) ULTRATHIN HEAT DISSIPATION STRUCTURE

(71) Applicants: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

(72) Inventors: Ning Hou, Shenzhen (CN); Cong Lei, Shenzhen (CN); Biao Li, Shenzhen (CN); Ming-Jaan Ho, New Taipei (TW)

(73) Assignees: Avary Holding (Shenzhen) Co., Limited., Shenzhen (CN); HongQiSheng Precision Electronics (QinHuangDao) Co., Ltd., Qinhuangdao (CN); GARUDA TECHNOLOGY CO., LTD., New Taipei (TW)

( * ) Notice: Subject to any disclaimer, the term of this patent is extended or adjusted under 35 U.S.C. 154(b) by 365 days.

(21) Appl. No.: 15/191,550

(22) Filed: Jun. 24, 2016

(65) Prior Publication Data

US 2017/0325356 A1 Nov. 9, 2017

(30) Foreign Application Priority Data

May 9, 2016 (CN) .......................... 2016 1 0302508

(51) Int. Cl.
*H05K 7/20* (2006.01)

(52) U.S. Cl.
CPC ......... *H05K 7/2029* (2013.01); *H05K 7/2039* (2013.01)

(58) Field of Classification Search
CPC ........ F28D 15/02; F28D 15/04; F28D 15/046; F28D 15/0266; F28D 15/0233; H01L 23/427; B23P 2700/09; B23P 15/26
USPC .................... 165/104.26, 104.21; 29/890.032
See application file for complete search history.

(56) References Cited

U.S. PATENT DOCUMENTS

| | | | | |
|---|---|---|---|---|
| 3,680,189 | A * | 8/1972 | Noren ..................... | B21D 53/02 165/104.26 |
| 4,311,131 | A * | 1/1982 | Sabat ...................... | F28F 23/00 126/637 |
| 5,642,776 | A * | 7/1997 | Meyer, IV .......... | F28D 15/0233 165/104.26 |
| 6,082,443 | A * | 7/2000 | Yamamoto .......... | F28D 15/0233 165/104.21 |

(Continued)

*Primary Examiner* — Jianying C Atkisson
*Assistant Examiner* — Jose O Class-Quinones
(74) *Attorney, Agent, or Firm* — ScienBiziP, P.C.

(57) ABSTRACT

An ultrathin heat dissipation structure includes a copper clad sheet, a cover, a number of bond blocks, and a phase-change material. The copper clad sheet is given containing grooves and a number of ribs round each containing groove. The containing grooves are formed by stamping. The copper clad sheet includes an insulation layer. The copper clad layer is inner surface of the containing groove. The bond blocks are arranged on the ribs and cover is pressed to the stamped copper clad sheet and secured using the bond blocks. The containing grooves form sealing cavities and the phase-change material in the sealed cavity gathers and transfers out any heat generated by components.

10 Claims, 6 Drawing Sheets

(56) References Cited

U.S. PATENT DOCUMENTS

| | | | |
|---|---|---|---|
| 6,269,866 B1* | 8/2001 | Yamamoto | F28D 15/0233 |
| | | | 165/104.26 |
| 6,817,097 B2* | 11/2004 | Sarraf | F28D 15/0233 |
| | | | 29/890.032 |
| 7,728,232 B2* | 6/2010 | Huang | C09J 7/10 |
| | | | 174/254 |
| 8,811,014 B2* | 8/2014 | Chauhan | H01L 23/427 |
| | | | 165/104.26 |
| 2001/0003308 A1* | 6/2001 | Li | F28D 9/0062 |
| | | | 165/104.33 |
| 2004/0177946 A1* | 9/2004 | Kawahara | F28D 15/0233 |
| | | | 165/104.11 |
| 2010/0071879 A1* | 3/2010 | Hou | F28D 15/0233 |
| | | | 165/104.26 |
| 2010/0181048 A1* | 7/2010 | Hwang | F28D 15/0233 |
| | | | 165/104.26 |
| 2012/0168435 A1* | 7/2012 | Chen | F28D 15/0233 |
| | | | 220/6 |
| 2015/0101785 A1* | 4/2015 | Ho | F28F 21/085 |
| | | | 165/170 |

* cited by examiner

ULTRATHIN HEAT DISSIPATION STRUCTURE

The subject matter herein generally relates to temperature control.

BACKGROUND

Since a high-power electronic device generates a large amount of heat during operation, the performance and lifetime of the electronic device is lowered if the heat cannot be dissipated in time.

BRIEF DESCRIPTION OF THE DRAWINGS

Implementations of the present technology will now be described, by way of example only, with reference to the attached figures.

DETAILED DESCRIPTION

Figure 1:
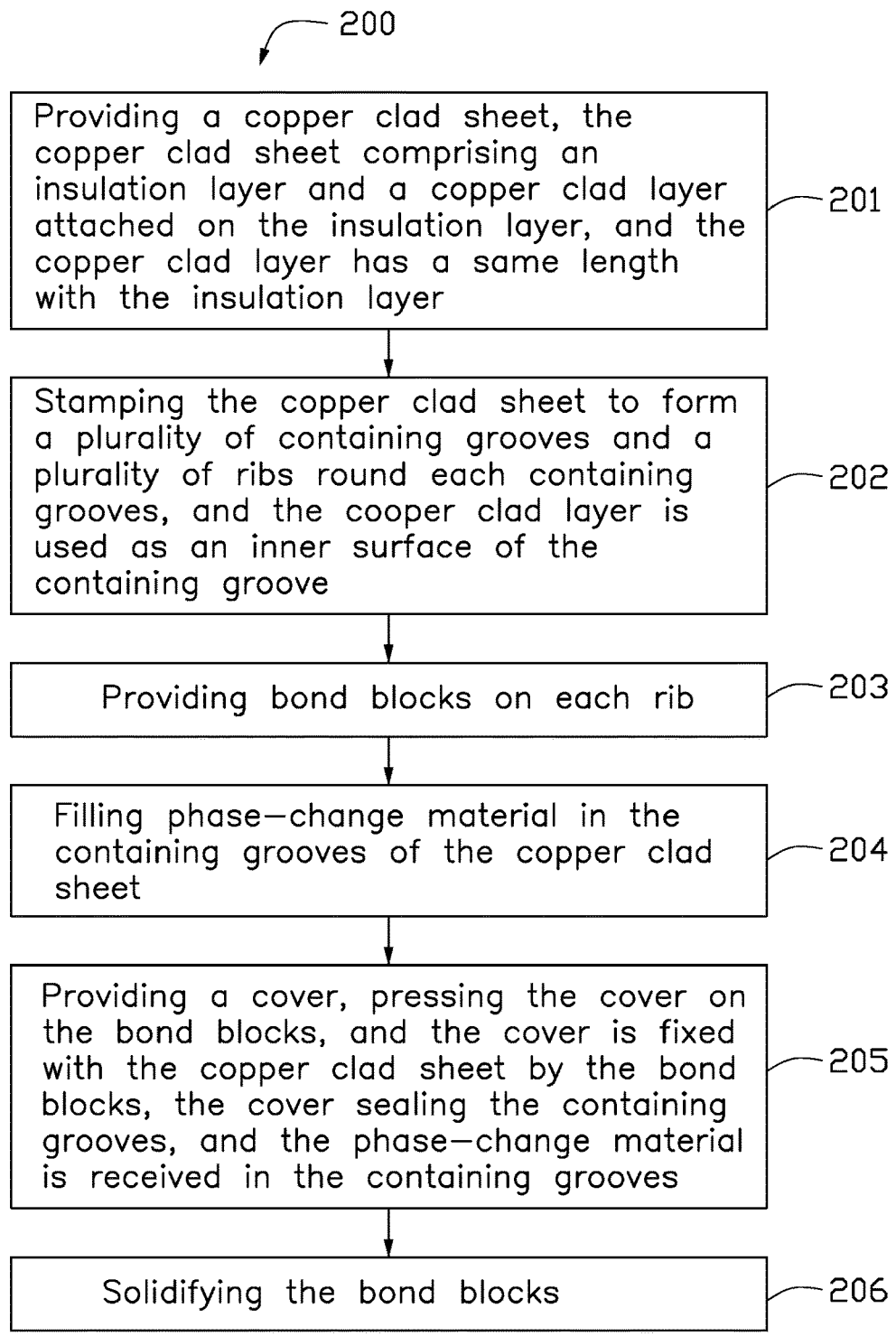
FIG. 1 illustrates a flowchart of a method for manufacturing a heat dissipation device.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented.

The term "substantially" is defined to be essentially conforming to the particular dimension, shape, or other feature that the term modifies, such that the component need not be exact. For example, "substantially cylindrical" means that the object resembles a cylinder, but can have one or more deviations from a true cylinder. The term "comprising," when utilized, means "including, but not necessarily limited to"; it specifically indicates open-ended inclusion or membership in the so-described combination, group, series, and the like. The references "a plurality of" and "a number of" mean "at least two."

Figure 8:
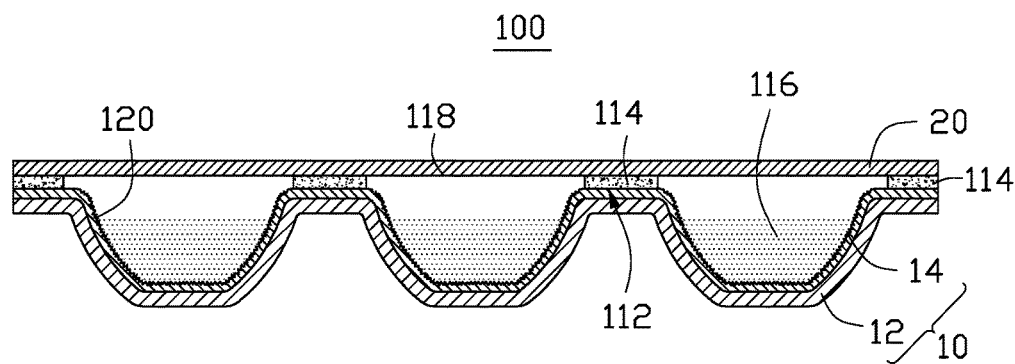
FIG. 8 is a diagrammatic view of the cover pressed to the copper clad sheet with containing grooves to form a heat dissipation structure.

FIG. 8 illustrates an ultrathin heat dissipation structure 100 according to a first embodiment. The ultrathin heat dissipation structure 100 includes a copper clad sheet 10, a cover 20 bonded with the copper clad sheet 10, a plurality of containing grooves 110 formed on the copper clad sheet 10, and a phase-change material 116 received in each containing groove 110.

The copper clad sheet 10 is a flexible single sided copper clad sheet which includes an insulation layer 12 and a copper clad layer 14 attached on the insulation layer 12.

The copper clad layer 14 has a same surface area with the insulation layer 12. A thickness of the insulation layer 12 is about 12~50 μm, and a thickness of the copper clad layer 14 is about 12~140 μm. The material of the insulation layer 12 is selected from the group consisting of polynaphthalene dicarboxylic acid glycol ester (PEN), polyimide (PI), or polyterephthalate (PET).

The copper clad sheet 10 forms a plurality of containing grooves 110 and a plurality of containing ribs 112 round each containing groove 110. A depth of each containing groove 110 is about 1000 μm. The containing groove 110 is formed by stamping. The copper clad layer 14 becomes an inner surface of the containing groove 110 and the insulation layer 12 is an outer surface of the containing groove 110.

Each containing groove 110 includes a bottom wall 111 and a side wall 113 around the bottom wall 111, and the bottom wall 111 is substantially flat. An angle between the side wall 113 and the bottom wall 111 is about 90°<α<180°. A thickness of the side wall 113 is less than that of the bottom wall 111.

A bond block 114 is formed on each rib 112 to bond the clad copper sheet 10 and the cover 20. The cover 20 seals each containing groove 110, and the cover 20 and each containing groove 110 together form a sealed cavity 118. The phase-change material 116 is received in the sealed cavity 118. The bond block 114 is formed of adhesive. The phase-change material 116 is solid-liquid phase-change material, such as paraffin or twenty-two alkane phase change material.

In dissipating heat, the ultrathin heat dissipation structure 100 is very thin and can be adhesively fixed with a heat generating member of an electronic device. Heat generated by the heat generating member is transferred and gathered at bottom of the copper clad sheet 10, and absorbed by phase-change material in the sealed cavity 118 and diffused through the copper clad sheet 10. When amount of heat absorbed by the ultrathin heat dissipation structure 100 reaches a critical temperature, the phase-change material 116 will change from solid state to gaseous state. The gaseous state will then change to liquid when a cold top of the sealed cavity 118 is reached, and flow to the sealed cavity 118 via the micro-structure 120. In this way, heat generated by the heat generating member is dispersed.

FIG. 1 illustrates a flowchart in accordance with a second embodiment. The example method 200 for manufacturing the ultrathin heat dissipation structure 100 (shown in FIG. 8) is provided by way of an example, as there are a variety of ways to carry out the method. Additionally, the illustrated order of blocks is by example only and the order of the blocks can change. The method 200 can begin at block 201.

Figure 2:
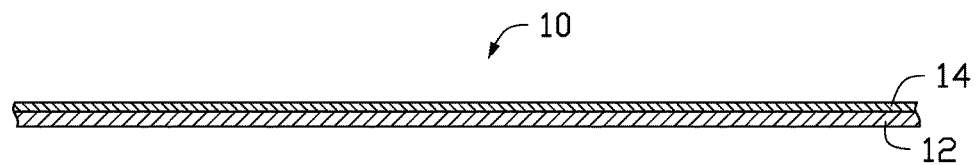
FIG. 2 is a diagrammatic view of a copper clad sheet in accordance with a first embodiment.

At block 201, as shown in FIG. 2, a copper clad sheet 10 is provided. The copper clad sheet 10 is a flexible single sided copper clad sheet. The copper clad sheet 10 includes an insulation layer 12 and a copper clad layer 14 attached on the insulation layer 12. The copper clad layer 14 has a same surface area with the insulation layer 12. A thickness of the insulation layer 12 is about 12~50 μm, and a thickness of the copper clad layer 14 is about 12~140 μm. The material of the insulation layer 12 is selected from the group consisting of polynaphthalene dicarboxylic acid glycol ester (PEN), polyimide (PI), or polyterephthalate (PET).

Figure 3:
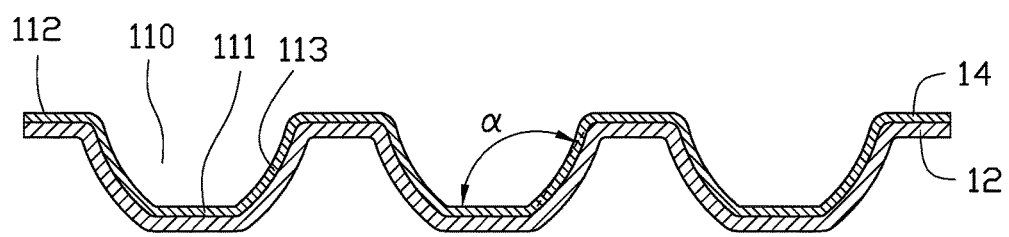
FIG. 3 is a diagrammatic view of forming a plurality of containing grooves and ribs round each containing groove in the copper clad sheet of FIG. 2.

At block 202, as shown in FIG. 3, the copper clad sheet 10 is stamped by a molding machine to form a plurality of containing grooves 110. The copper clad layer 14 becomes an inner surface of the containing groove 110 and the insulation layer 12 is then an outer surface of the containing groove 110. The copper clad sheet 10 includes a number of containing grooves and a number of ribs 112 around each containing groove 110. In the illustrated embodiment, a depth of the containing groove 110 is about 1000 μm.

Each containing groove 110 includes a bottom wall 111 and a side wall 113 around the bottom wall 111. The bottom wall 111 is substantially a flat plane. An angle between the side wall 113 and the bottom wall 111 is about $90°<\alpha<180°$. A thickness of the side wall 113 is less than that of the bottom wall 111 due to the containing groove 110 being formed by an embossing method.

Figure 4:
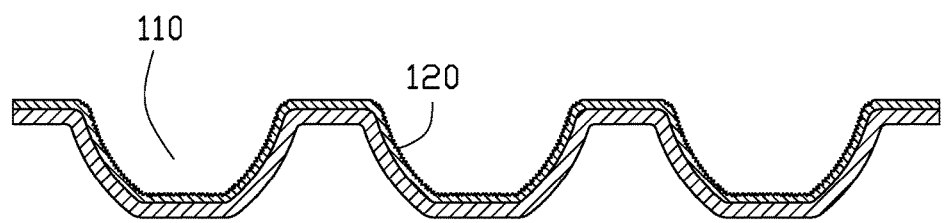
FIG. 4 is a diagrammatic view of micro-structures formed on an inner surface of the containing groove of FIG. 3.

At block 203, as shown in FIG. 4, the inner surface of the containing groove 110 is processed to form micro-structures 120. In the embodiment, the inner surface is cleaned to remove stains and grease, then the single sided flexible copper clad sheet 10 is etched or subjected to laser ablation to form the micro-structures 120 on the inner surface of the containing groove 110.

Figure 5:
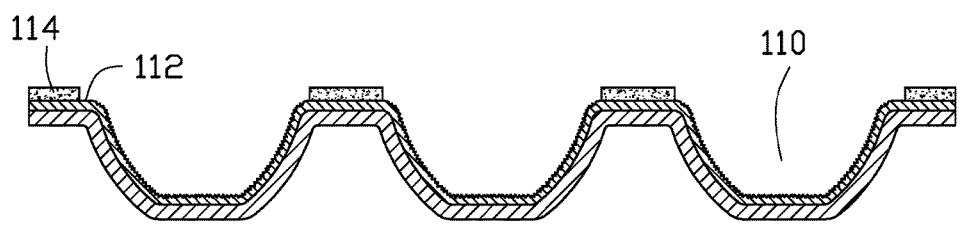
FIG. 5 is a diagrammatic view of joint blocks formed on the ribs of FIG. 4.

At block 204, as shown in FIG. 5, a number of bond blocks 114 are formed on the ribs 112 and containing grooves 110. A height of each bond block 114 is about 10~30 μm. The bond blocks 114 are formed using adhesive by screen printing and solidification of the adhesive. The bond blocks 114 mainly comprise molten resin material doped with metal particles. The metal particles are selected from a group comprising tin, bismuth, and any combination thereof. A diameter of each metal particle is in a range from about 25 μm to 45 μm. A weight ratio of tin in the adhesive 20 is in a range from about 37% to 38%. A weight ratio of bismuth in the adhesive 20 is in a range from about 51% to 52%. A weight ratio of molten resin in the bond 114 is in a range from about 4% to 6%. The proportions specified for the bond 114 enables better adhesion and less susceptibility to water.

Figure 6:
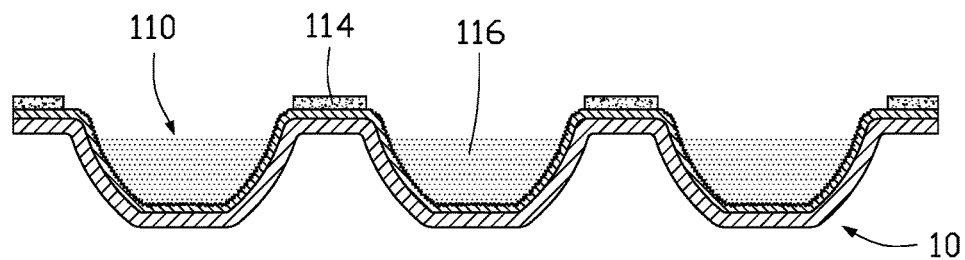
FIG. 6 is a diagrammatic view of phase-change material infilled in each of the containing grooves of FIG. 3.

At block 205, as shown in FIG. 6, a phase-change material 116 is provided and infilled into the containing grooves 110. The phase-change material 116 is solid-liquid phase-change material, such as paraffin to gather and transfer out heat generated by components.

Figure 7:
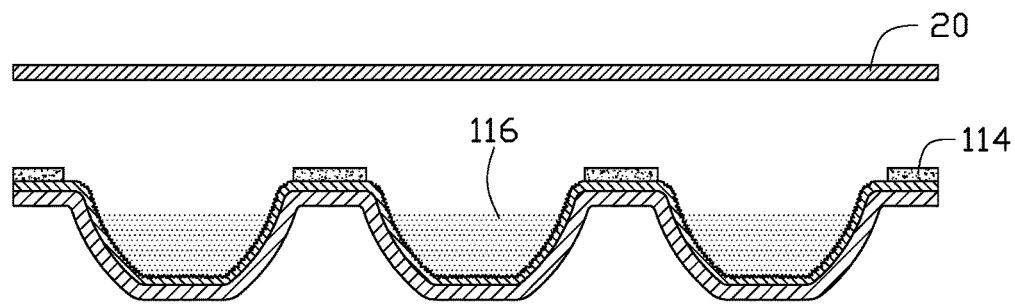
FIG. 7 a is a diagrammatic view of a cover provided above the copper clad sheet of FIG. 6.

At block 206, as shown in FIG. 7 and FIG. 8, a metal cover 20 is provided and pressed to the copper clad sheet 10. The bond blocks 114 bond the metal cover 20 and the copper clad sheet 10 together. The metal cover 20 is a copper foil or an aluminum foil or any other conductive sheet, and the metal cover 20 and each containing groove 110 together form a sealed cavity 118. The phase-change material 116 is received in the sealed cavity 118, and the bond blocks 114 are solidified to form the ultrathin heat dissipation structure 100.

Figure 9:
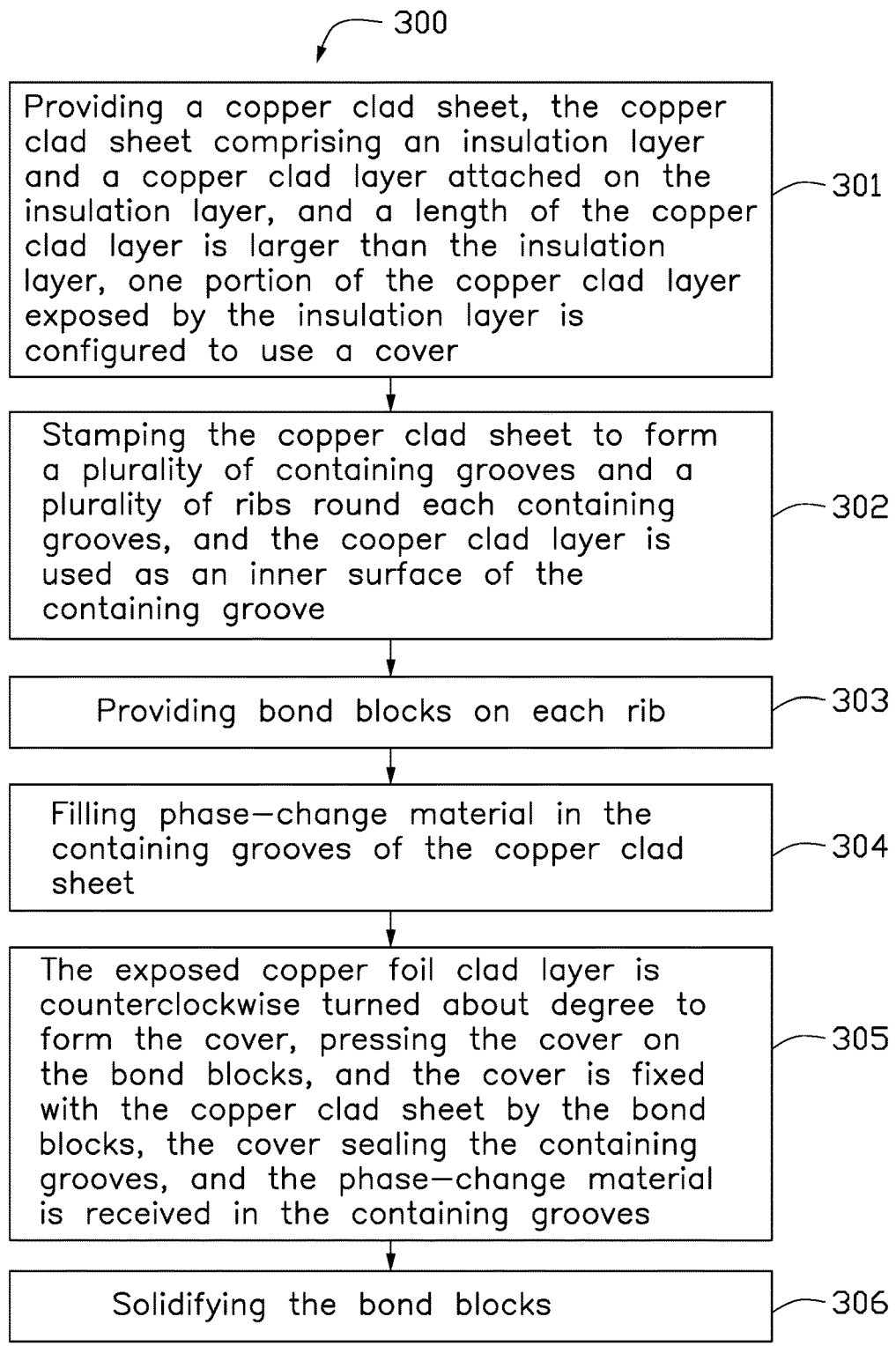
FIG. 9 illustrates a flowchart of a method for manufacturing the heat dissipation device of FIG. 8.

FIG. 9 illustrates a flowchart in accordance with a third embodiment. The example method 300 for manufacturing the thin heat dissipation structure 400 (shown in FIG. 1) is provided by way of an example, as there are a variety of ways to carry out the method. Additionally, the illustrated order of blocks is by example only and the order of the blocks can change. The method 300 can begin at block 301.

Figure 10:
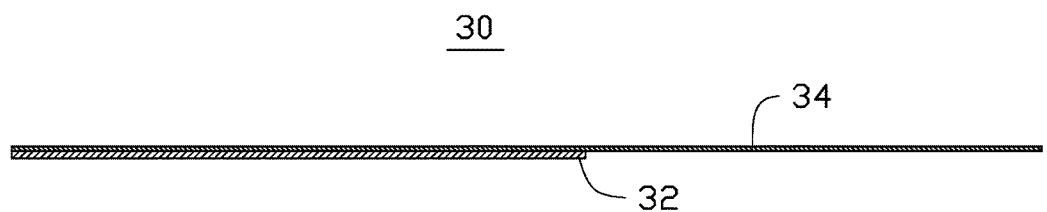
FIG. 10 is a diagrammatic view of a copper clad sheet in accordance with a third embodiment.

At block 301, as shown in FIG. 10, a copper clad sheet 30 is provided. The copper clad sheet 30 includes an insulation layer 32 and a copper clad layer 34 attached on the insulation layer 32. A surface area of the copper clad layer 34 is larger than a surface area of the insulation layer 32. In the illustrated embodiment, a surface area of the copper clad layer 34 is two times of a surface area of the insulation layer 12. One portion of the copper clad layer 34 exposed by the insulation layer 32 is configured to form a cover 40, the other portion of the copper clad sheet 30 is configured to form the containing groove 310.

Figure 11:
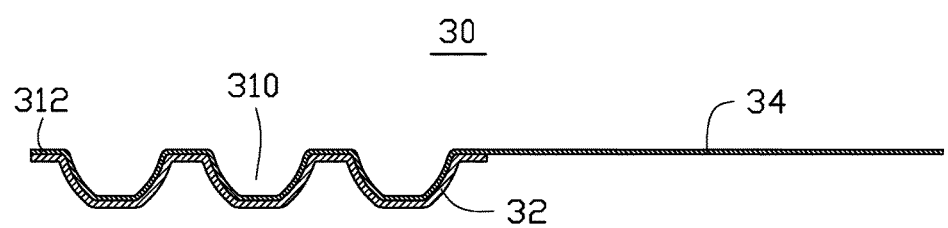
FIG. 11 is a diagrammatic view of a plurality of containing grooves and ribs round each containing groove of the copper clad sheet of FIG. 10.

At block 302, as shown in FIG. 11, the copper clad sheet 30 is stamped by a molding machine to form a plurality of containing grooves 310.

Figure 12:
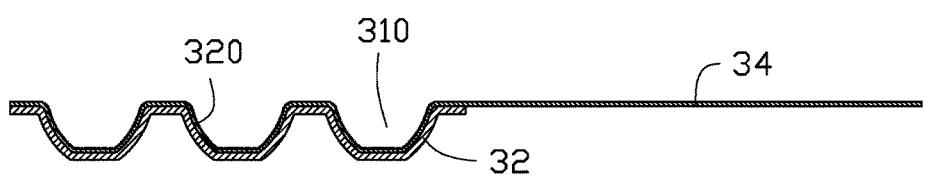
FIG. 12 is a diagrammatic view of micro-structures formed on an inner surface of the containing grooves.

At block 303, as shown in FIG. 12, the inner surface of the containing groove 310 is processed to form micro-structures 320.

Figure 13:
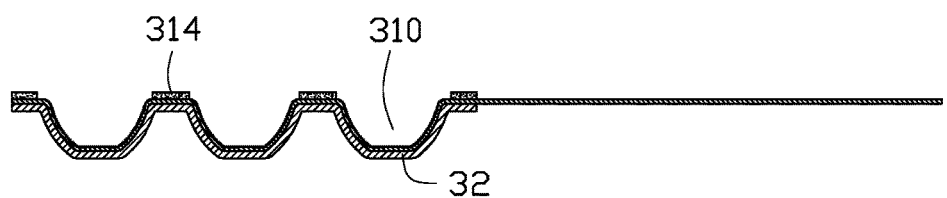
FIG. 13 is a diagrammatic view of joint blocks formed on the ribs.

At block 304, as shown in FIG. 13, bond blocks 314 are formed on the ribs 312, and each bond block 314 round each containing groove 310.

Figure 14:
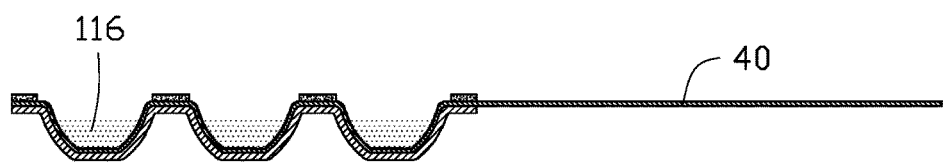
FIG. 14 is a diagrammatic view of a phase-change material infilled in each of the containing grooves.

At block 305, as shown in FIG. 14, a phase-change material 116 is provided and is infilled into the containing groove 310.

Figure 15:
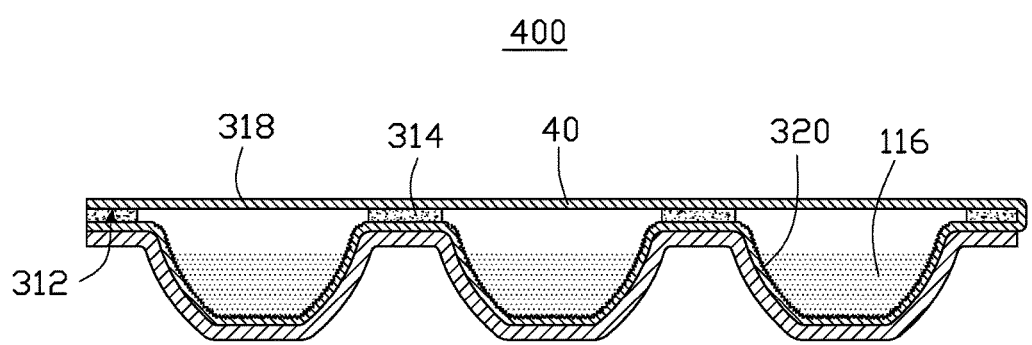
FIG. 15 is a diagrammatic view of the copper clad sheet pressed to the containing grooves of FIG. 14 to form the heat dissipation structure.

At block 306, as shown in FIG. 15, the exposed copper clad layer 34 is counterclockwise turned about 180 degree to form the cover 40, and the cover 40 is pressed to the single side flexible copper clad sheet 30 with the containing groove 310. The cover 40 is bonded to the containing grooves 310 using the bond block 314, the cover 40 and each containing groove 310 together form a sealed cavity 318 and the phase-change material 116 is received in the sealed cavity 318, and the bond blocks 314 is solidified, and then the heat dissipation structure 400 is formed. A total thickness of the heat dissipation structure 400 is the sum of the thicknesses or depths of the cover 40, of the bond block 314, of the containing groove 310, and of the bottom of the containing groove 310. In this embodiment, the thickness of the cover 40 refers to a thickness of the copper clad layer 10, as shown in FIG. 15, the thickness of the cover 40 being about 12~140 μm. A depth of each containing groove 110 is about 1000 μm, and the bottom of the containing groove 310 means the copper clad sheet 10. The thickness of the copper clad sheet 10 is about 24190 μm. Thereby, the total thickness of the heat dissipation structure 400 is about 1.5 mm. The heat dissipation structure 400 is very thin, very flexible, and can be adhesively fixed to a heat generating member of an electronic device.

The embodiments shown and described above are only examples. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A heat dissipation structure comprising:
   a copper clad sheet comprising a plurality of containing grooves and a plurality of ribs round each containing groove, each of the plurality of containing grooves formed by stamping, the copper clad sheet comprising an insulation layer and a copper clad layer attached on the insulation layer, wherein a surface of the copper clad layer facing away from the insulation layer forms an inner surface of the plurality of containing grooves, the insulation layer follows a contour of the copper clad layer and has a same shape as that of the copper clad layer;
   a plurality of bond blocks arranged on the ribs;
   a cover being fixed on the copper clad sheet with the containing groove using the bond blocks, the cover sealing the plurality of containing grooves to form a plurality of a sealed cavities; and
   a phase-change material contained in the sealed cavity and configured to absorb and transfer out heat generated by components.

2. The heat dissipation structure of claim 1, wherein the inner surface of each of the plurality of containing grooves comprises micro-structures.

3. The heat dissipation structure of claim 2, wherein each of the plurality of containing grooves comprises a bottom wall and a side wall around the bottom wall, and the bottom wall is substantially flat, an angle between the side wall and the bottom wall is $90°<\alpha<180°$, a thickness of the side wall is thinner than that of the bottom wall.

4. The heat dissipation structure of claim 1, wherein the copper clad layer has a same surface area with the insulation layer, and a cross-section shape of the inner surface of each containing groove is same as a cross-section shape of the outer surface of each containing groove.

5. The heat dissipation structure of claim 3, wherein the cover is made of metal.

6. The heat dissipation structure of claim 3, wherein a surface area of the copper clad layer is larger than a surface area of the insulation layer.

7. The heat dissipation structure of claim 6, wherein a surface area of the copper clad layer is two times a surface area of the insulation layer.

8. The heat dissipation structure of claim 7, wherein the copper clad layer exposed by the insulation layer is turned about 180 degree to form the cover.

9. The heat dissipation structure of claim 1, wherein the plurality of bond blocks is formed of adhesive by screen printing and solidification of the adhesive, the plurality of bond blocks comprises molten resin material doped with metal particles, the metal particles are selected from a group comprising tin, bismuth, and any combination thereof, a diameter of the metal particle is in a range from about 25 um to 45 um, a weight ratio of tin in the adhesive is in a range from about 37% to 38%, a weight ratio of bismuth in the adhesive is in a range from about 51% to 52%, a weight ratio of molten resin in the bond blocks is in a range from about 4% to 6%.

10. The heat dissipation structure of claim 1, wherein the phase-change material is solid-liquid phase-change material.

* * * * *